US007398194B2

(12) United States Patent
Evans et al.

(10) Patent No.: US 7,398,194 B2
(45) Date of Patent: Jul. 8, 2008

(54) DISTRIBUTED ENERGY RESOURCES

(76) Inventors: Peter B. Evans, 25259 La Loma Dr., Los Altos Hills, CA (US) 94022; Steven E. Schumer, 1132 N. Seventh St., San Jose, CA (US) 95112

( * ) Notice: Subject to any disclaimer, the term of this patent is extended or adjusted under 35 U.S.C. 154(b) by 0 days.

(21) Appl. No.: 11/510,430

(22) Filed: Aug. 25, 2006

(65) Prior Publication Data
US 2007/0005315 A1    Jan. 4, 2007

Related U.S. Application Data

(62) Division of application No. 10/666,209, filed on Sep. 17, 2003.

(51) Int. Cl.
    G06G 7/62    (2006.01)
    G06G 7/48    (2006.01)
    G06G 7/00    (2006.01)
    G06F 17/50   (2006.01)
    G06F 19/00   (2006.01)
    G01R 15/00   (2006.01)
    G05B 13/02   (2006.01)
    G05B 13/00   (2006.01)

(52) U.S. Cl. ............................. 703/18; 702/57; 700/29; 700/286; 700/291

(58) Field of Classification Search .................. 703/13; 702/57; 700/29, 286, 291
See application file for complete search history.

(56) References Cited

U.S. PATENT DOCUMENTS 6,549,880 B1 * 4/2003 Willoughby et al. .......... 703/13
6,885,915 B2 * 4/2005 Rehtanz et al. ............. 700/291
7,096,175 B2 * 8/2006 Rehtanz et al. .............. 703/18
2007/0203779 A1 * 8/2007 Tveit et al. ..................... 705/9

OTHER PUBLICATIONS

Optimal Technologies, "Operations Review of Jun. 14, 2000 PG&E Bay Area System Evenets Using Aempfast Software" Oct. 3, 2001, 32 pgs.*
Lasseter et al. "Scenarios for Distributed Technology Applications with Steady State and Dynamic Models of Loads and Micro-Sources" Consortium for Electric Reliability Technology Solutions, Apr. 14, 2000, 90 pgs.*
Marnay et al. "Modeling of Customer Adoption of Distributed Energy Resources" Consortium for Electric Reliability Technology Solutions, Aug. 2001, 110 pgs.*

(Continued)

Primary Examiner—Kamini Shah
Assistant Examiner—Suzanne Lo
(74) Attorney, Agent, or Firm—Fenwick & West LLP

(57) ABSTRACT

An improved method for analyzing power systems; in particular, power systems that may incorporate distributed energy resources (DER), that provides a thorough determination of the potential for network performance improvement that DER could provide, independent of non-network benefits DER could provide. The method incorporates an Energynet dataset simulating the power system, integrating transmission and distribution elements together and capable of evaluating the impacts of additions of real energy sources and/or reactive energy sources anywhere in the network. Such energy source additions are evaluated for their impact on a broad set of performance measures. The specific DER projects that would realize that potential improvement in network performance are characterized as an Optimal DER Portfolio. Network performance improvement attributable to the Optimal DER Portfolio is quantified in engineering and financial terms.

4 Claims, 5 DrawingSheets

OTHER PUBLICATIONS deVos et al. "Knowledge representation for power system modeling" IEEE, 2001, 9 pages.*

The Mathworks, "SimPowerSystems 4 Data Sheet", Sep. 2004, 4 pages.*

OPAL-RT, "RT-LAB Electrical Engineering Simulator", 2003, 2 pages.*

"AEMPFAST® SOFTWARE" (product description), Optimal Technologies International Inc., [online] Retrieved form the Internet<URL:http://www.otii.com/aempfasthtml>, date unknown.

Alderfer, R. B., et al., "Making Connections, Case Studies of Interconnection Barriers and their Impact on Distributed Power Projects", NREL/SR-200-28053, May 2000.

"Applications Guide: Distribution Capacity Planning With Distributed Resources", EPRI, Palo Alto, CA: 1999. TR-114684 (Final Report, Jan. 2000).

Hope, G. et al., "Operations Review of Jun. 14, 2000, PG&E Bay Area System Events Using Aempfast® Software", Final Report, Oct. 3, 2001, pp. 1-30, Optimal Technologies International Inc., Lawrence Berkeley National Lab (California, US).

Li, S. et al., "Load Following Functions Using Distributed Energy Resources," IEEE, 2000, pp. 1756-1761.

"The Optimal Portfolio Methodology for Assessing Distributed Energy Resource Benefits for the Energynet", Aug. 12, 2003, New Power Technologies.

Silberman, Steve, "The Energy Web", WIRED Magazine, vol. 9.07, Jul. 2001. [online] [Retrieved on Oct. 21, 2004] Retrieved from the Internet<URL:www.wired.com/wired/archive/9.07/juice.html>.

Tolbert, L.M. et al., "Scalable Multi-Agent System for Real-Time Electric Power Management," IEEE, 2001, pp. 1676-1761.

\* cited by examiner

DISTRIBUTED ENERGY RESOURCES

RELATED APPLICATIONS

This application claims the benefit under 35 U.S.C. § 120 as a divisional application of Ser. No. 10/666,209 filed on Sep. 17, 2003, by P. B. Evans.

FIELD OF THE INVENTION

The present invention relates generally to power transmission and distribution systems or networks, and more particularly to such power networks that may incorporate distributed energy resources.

BACKGROUND OF THE INVENTION

1. Prior Art

Distributed energy resources, or DER, may include power generation capacity located at customer sites and/or located near load centers. This is sometimes referred to in the art as "distributed generation" to distinguish it from central station generation, which is prevailing in the art.

It is increasingly understood in the art that reduction of demand upon command from the system operator, sometimes referred to as "dispatchable demand reduction" or load shedding, is in some respects an alternative to adding incremental generating capacity. The capacity, or energy source, represented by dispatchable demand reduction is, by definition, located at customer sites. Dispatchable demand reduction thus may be considered DER.

DER may also include the capacitors, reactive energy sources that provide reactive power capacity, and that are located at various points within either the transmission system or the distribution system as part of conventional practice in the art. It should be noted that in this description we use the term capacity with two meanings depending on context. Capacitors may have a certain capacity value or capicitance and energy sources provide added capacity to the network, either as real power, e.g., a generator, or reactive power, e.g., a capacitor bank.

The potential for distributed energy resources to augment traditional central-station power generation approaches is widely discussed within and outside the power industry. However, the prior art includes no methodology that thoroughly assesses and values the potential benefits of DER. Specifically, current methods fail to thoroughly assess and value the potential benefits of DER to transmission or distribution (T&D) systems themselves. Such benefits are to be considered distinct from potential benefits of DER to customers or the environment.

*Making Connections: Case Studies of interconnection Barriers and their Impact on Distributed Generation Projects*, Alderfer, Eldrige, and Stars, NREL/SR-20028053, May 2000, is one of many references in the art that acknowledges the potential for DER (in this case power generation at the energy customer's site) to provide benefits to customers. Such customer benefits may include increased reliability or reduced energy costs. *Making Connections* also acknowledges the potential for DER to provide benefits for the environment. These environmental benefits might include production of electric power at higher levels of efficiency (thus, reduced fuel use) or reduced environmental impacts through the use of advanced or renewable technologies.

However, *Making Connections* makes no reference to the potential for DER to provide benefits to T&D systems per se, over and above the potential benefits of DER for customers and the environment.

Where impacts of DER on T&D systems are considered, current methods do not provide a means to assess the potential benefits of DER to such T&D systems.

*PIER Strategic Program—Strategic Distributed Energy Resources Research Assessment Interim Report*, Arthur D. Little, P600-01-016, August 2001, considers grid impacts of DER at length. However, this report considers grid impacts of DER as a looming problem that may have to be dealt with if the level of penetration of DER is great enough. The report's literal characterization of the DER grid impacts issue is "Would a high penetration of DER have an adverse impact on the T&D system?" The report does not anticipate the affirmative use of DER as a means to improve performance of the T&D network.

Where DER is considered to have potential benefits for transmission and distribution systems, current methods fail to provide a thorough assessment and valuation of the potential benefits.

"The Energy Web," by Steve Silberman, *Wired* Magazine, Sep. 7, 2001, describes an "Energy Web" with diversified resources close to customers managed by intelligent agents throughout the network. This infrastructure would have less environmental impact and provide more choices to customers. Silberman certainly implies that there could be grid benefits as well. However, Silberman offers no means for thoroughly determining what those benefits might be.

There is a need for a method to thoroughly assess and value the potential benefits of DER to transmission or distribution (T&D) systems themselves. Such a method should be analytically defensible. Also, such a method should quantify such benefits objectively, distinct from potential benefits of DER to customers or the environment.

The lack of an analytical basis for purported engineering and economic benefits of DER to T&D systems prevents sound business decision-making and policy-making that could facilitate the implementation of DER. If the potential T&D benefits of DER were objectively established, greater opportunities for the deployment of DER would emerge. DER projects could be deployed to provide direct benefits to customers, direct benefits to the environment, and also direct benefits to the T&D systems. With T&D benefits established independent of customer and environmental benefits, those projects that more than one set of benefits could be identified.

Regulations affecting industrial facilities and the practices relating to interconnection of devices to T&D systems have been developed over time, for the most part without anticipation or consideration of the possible widespread deployment of DER. These regulations and practices may now, without specific intent, represent barriers to DER projects. This topic is the primary focus of *Making Connections*. However, removal of barriers to broader deployment of DER is a daunting problem for regulatory authorities, network operators and DER practitioners. A clear demonstration of the benefits of DER to T&D systems would provide greater motivation for network operators and other stakeholders to engage in the reformation of these barriers. Also, a determination of which barriers have the greatest impact on the DER projects having the most potential benefits for the system would provide a basis for targeting these reformation efforts.

T&D system analysis and planning methods in the art have significant limitations in making a thorough assessment of the potential benefits of DER to a given T&D network.

Traditional transmission system analysis methods in the art do not directly consider the related distribution systems. As a result, traditional approaches prohibit direct assessment of the extent to which transmission level problems arise from problems in the distribution system. Moreover, traditional approaches thus also prohibit direct assessment of the extent to which transmission level problems that may arise from problems in the distribution system are best mitigated at the distribution level, e.g. with DER.

Likewise, as noted below, distribution system analysis methods in the art do not directly consider the transmission network. As a result, traditional distribution analysis approaches prohibit direct assessment of the extent to which distribution level problems arise from problems in the transmission system. Traditional approaches thus also prohibit direct assessment of the extent to which distribution level problems that may arise from problems in the transmission system are best mitigated at the distribution level.

Methods and analytical tools for characterizing the conditions of high-voltage transmission systems and identifying problems therein are well known in the art. Some of these methods and analytical tools are described in U.S. Pat No. 5,594,659 to Schleuter and U.S. Pat No. 5,796,628 to Chiang. A common class of analytical methods is referred to in the art as "power flow" techniques.

There have also been recent advances in these methods. Of particular interest are analytical tools that use analytical methods to determine optimal transmission network control variable settings to minimize losses or power costs, as well as tools that use analytical methods to identify locations for reactive capacity additions. Another area of recent interest is tools that analyze a system's proximity to voltage collapse, or its voltage stability security. Schleuter's Method for Performing a Voltage Stability Security Assessment for a Region of an Electric Power Transmission System is an example of recent voltage security analytics. Chiang's Dynamic Method for Preventing Voltage collapse in Electrical Power Systems is another. These are discussed further below.

Methods and analytical tools for characterizing the conditions of distribution systems and identifying problems therein are also well known in the art. Some of these tools also use power flow methods. These tools have been enhanced recently with the development of the capability to consider unbalanced three-phase flow. These tools are thus well-suited to perform detailed design of distribution feeders with DER.

However, distribution system analysis methods in the art consider distribution circuits or feeders individually rather than as part of a network. As a result, traditional approaches prohibit direct assessment of the extent to which problems arising on one distribution feeder may affect, or be caused by, or may be best remedied on other distribution feeders.

Thus, by treating transmission and distribution systems independently, and by treating distribution feeders individually, conventional methods in the art effectively prevent considering whether network deficiencies observed at the transmission level may be more effectively remedied by DER interconnected at distribution-level voltages. Thus, the prior art presents significant limitations to a thorough assessment of the potential benefits of DER to a given T&D network.

Traditional analysis and planning of either transmission or distribution systems typically considers only changes in transmission or distribution elements—e.g. new lines, or new transformers, or reconfigurations or new settings for control variables, or in some cases new reactive capacity additions—as the means to improve network performance.

Where non-wires alternatives are considered, a class of alternatives, i.e., dispatchable demand reduction, reactive capacity, or generation, may be considered alone. Traditional methods do not include consideration of these alternatives interchangeably to achieve a certain outcome. In addition, traditional methods do not consider the broad set of impacts such alternatives may have. In particular, DER is often seen as a way to gain incremental energy or capacity, but using DER to improve system stability or even reduce losses is often not considered.

Thus, conventional approaches in the art, by failing to consider a broad set of DER alternatives and broad set of factors impacted by DER, cannot provide a comprehensive assessment of the potential benefits of DER to T&D systems.

Conventional approaches prohibit direct assessment of the extent to which non-wires alternatives such as power generation embedded within the network or dispatchable demand reduction, particularly those placed in the distribution portion of the network, could be used improve overall network performance, such as stability or voltage security.

These approaches also prohibit direct assessment of the extent to which such non-wires alternatives, particularly those placed in the distribution portion of the network, could be used to augment, defer, or avoid conventional network additions, particularly in the transmission portion of the network.

Neither the Chiang method or the Schleuter method deal directly with the question of the extent to which problems in a transmission system are the result of problems in the associated distribution system. Also, neither deals directly with the question of whether mitigating problems close to their source in the distribution system may be more effective than mitigating them at the transmission level. Chiang's method is demonstrated using transmission-only datasets, consistent with conventional practice in the art. Even though Schleuter notes that voltage instability problems can arise in both distribution systems and in transmission systems, his method does not provide any means for taking into account voltage instability problems in the distribution system. In fact, Schleuter's method excludes those instability problems that arise in distribution systems from consideration. Schleuter's method focuses exclusively on transmission systems and mathematical models of transmission systems.

Neither Chiang's method or Schleuter's method anticipates consideration of instability problems in distribution systems in the analysis of instability problems in transmission system. Also, neither anticipates any analysis to assess the degree to which instability problems in the transmission system arise from or are exacerbated by instability problems in the distribution system. Also, neither anticipates consideration of the extent to which mitigation of instability problems in the distribution system could also mitigate instability problems in the transmission system.

Neither Chiang's method or Schleuter's method anticipates the analysis of transmission and distribution integrated together as a single network to assess and/or remedy instability problems in the network overall. Also, neither anticipates consideration of the relative merits of mitigating instability problems in the distribution system rather than (or in addition to) mitigating them in the transmission system.

Schleuter's method is a voltage stability assessment method only. It does not provide a means to determine whether additions of real or reactive capacity within the system analyzed could mitigate the problems identified and improve voltage stability and system security.

Chiang's method provides the means to make a stability assessment on a near-term look-ahead basis (specifically 25 minutes ahead) based on anticipated loads. The method provides "load margin measures" or measures of the system's ability to withstand deviations from forecast load and generation conditions based on forecast voltage profiles. The method also anticipates operating responses including the addition of power generating capacity or load sheds to maintain stability in those areas of the system identified by the method as becoming weak.

Chiang's method does consider operational responses to predicted voltage collapse conditions; however, this method is designed to guide operational responses given the short (25 minute) predictive window. These responses would presumably be limited to deployment of existing load shed, generation or reactive capacity opportunities. Chiang's method does not address the question of how generation, load sheds, and reactive capacity, considered as interchangeable alternatives, could be embedded anywhere in the network on a planning basis to achieve the greatest improvement in network performance. Given a method to determine those additions of real and reactive capacity throughout the T&D network that would achieve the greatest operational improvement, Chiang's method could be used to guide operation or dispatch of that embedded capacity.

U.S. Pat No. 5,422,561 to Williams, et. al., describes a control strategy for reactive power capacity (switchable capacitors) installed in a power circuit that serves customer loads to control both customer voltage and reactive power flow in the circuit. The objective of the strategy is to increase generator efficiency by reducing the reactive power generators must provide, and to reduce losses and improve throughput capability of the circuit.

U.S. Pat No. 5,760,492 to Kanoi et. al., describes a control strategy for real power capacity (distributed generation) installed on a distribution feeder. The objective of Kanoi's strategy is to operate distributed generation units on the feeder to achieve a certain operating condition on the feeder.

The Williams strategy is based on the premise, accepted in the art, that reactive capacity close to the customer load is more effective than reactive capacity provided by a remote power generation source. Kanoi notes that widely varying conditions in lower voltage-level distribution systems, particularly where distributed generation units are present, make it difficult to control power quality merely by controlling voltage and reactive power at the transmission level.

However, both the Williams and Kanoi control strategies focus on individual lines of a power system. In neither case are the lines in question considered as part of a larger network comprised of many similar and dissimilar lines. The Williams strategy considers the impact of switching capacitors in a line with multiple voltages, where those voltages could represent transmission and distribution levels. But it does not contemplate the impact of switching capacitors throughout the network on conditions throughout the network. The Kanoi strategy considers the impact of dispatching generating units in a distribution line on the conditions of that line, its associated step-down transformer and its associated transmission line. It does not contemplate the impact of dispatching distributed generation units embedded throughout the network on conditions throughout the network.

Thus, in a limited way, both the Williams strategy and the Kanoi strategy acknowledge that problems in a transmission system may be the result problems in the distribution system, or that problems in a transmission system may be best mitigated in the distribution system. However, because both strategies focus on individual lines, not the network, neither is capable of addressing the extent to which problems observed in the transmission system are the accumulation of problems in the distribution system. Further, neither is capable of assessing the extent to which problems observed at either the transmission or distribution level are best mitigated at the distribution level, e.g. using DER.

Both the Williams and Kanoi strategies are operational strategies. In the case of Williams, the strategy focuses on the switching of existing capacitors to achieve certain types of operational improvements on the circuit. In the case of Kanoi, the strategy focuses on dispatching of distributed generation to achieve certain types of operational conditions on the distribution line and at its associated step-down transformer. Neither strategy considers where on a planning basis reactive capacity (in the case of the Williams strategy) or real capacity (in the case of the Kanoi strategy) should be located to provide the greatest benefit for the line in question. Further, neither considers where reactive or real capacity, as the case may be, should be placed within a broader network to provide the greatest benefit for the network.

Both strategies are examples of the practice in the art of considering a single class of embedded capacity and a narrow set of performance criteria. In the case of Williams, reactive capacity is managed to increase generator efficiency, reduce losses, and improve throughput capability of the circuit in question. In the case of Kanoi, real capacity is managed to achieve a given set of conditions on the distribution line and at the step-down transformer, specifically voltage levels. The Williams strategy does not consider real capacity (load sheds) or real and reactive power together (embedded generation) as additional means to improve performance of the circuit. The Kanoi strategy does not consider reactive capacity (capacitors) or load sheds as additional means to improve performance. The Williams strategy does not consider the impacts of adding or removing reactive capacity on the stability or voltage security of the circuit. The Kanoi strategy considers voltage, but not reactive power requirements or reactive power flows.

Because both strategies focus on an individual line, neither can address the question of the extent to which problems observed in a transmission system are the result of problems observed in the associated distribution system.

Because both strategies are limited to a single line and a single class of capacity, neither can address the broader question of whether mitigating network problems close to their source in the distribution system may be a more effective means of mitigating problems observed at the transmission level.

Most importantly, neither strategy can address the question of how generation, load sheds, and reactive capacity, considered as interchangeable alternatives, could be embedded anywhere in the broad network to achieve the greatest improvement in network performance.

U.S. Pat No. 5,684,710 to Ehlers describes the remote control of loads, specifically the restoration of power following an outage and the detection of outages. Again, Ehler's method does not consider any impacts beyond the distribution system, and does not consider any management of loads alone or in concert with other forms of DER for the purpose of enhancing network performance.

U.S. Pat No. 5,414,640 to Seem describes dispatchable demand reduction as an element in a power system. However. Seem's method considers dispatchable demand reduction only as a means to reduce energy consumption, not to as a means to improve T&D network performance. His method does not envision taking into account impacts on the transmission system or the coordination of the installation or operation of demand reduction with power generation and/or reactive capacity in the power system.

U.S. Pat No. 4,208,593 to Sullivan describes controllable electrical demand (or dispatchable demand management) in the art as selective disconnection of loads at specified levels of aggregate load. Sullivan describes a method and system for controlling electrical demand that overcomes disadvantages in the prior art arising from failures of the control system. Sullivan's method also introduces the capability to control demand on the basis of time as well as aggregate load. Again, Sullivan's method does not anticipate the use of dispatchable demand reduction as a way to improve network performance.

U.S. Pat No. 5,278,772 to Knupp describes a method for determining the operating profile, or dispatch, of multiple power generation units in a power system. However, under Knupp's method power generation units are dispatched based on their operating costs only. No consideration is given to the impact the operation of these units may have on network performance, and the dispatch of these units to improve network performance is not anticipated.

In *Integrated Assessment of Dispersed Energy Resource Deployment* (C. Marnay, R. Blanco, K. S. Hamachi, C. P. Kawaan, J. C. Osbom, F. J. Rubio, LBNL-46082, June 2000), the authors looked at the impacts of DER on the power system. However, the bulk of their study focused on the customer drivers for DER in an effort to develop a way to predict customer adoption. The implication is that DER adoption decisions are made by customers on their own without any knowledge or acknowledgement of the impacts on the grid. These customer decisions are thus something for the network operator to guess at and react to, hence the value of a predictive model. The study does not anticipate an assessment by the network operator of the types of DER projects that enhance network performance and/or the development of incentives to actively encourage such projects.

The study acknowledges that the "optimal" penetration of DER will require improved economic signals from the network operator to the customers, and states the need to compute such signals, but goes no further.

While the study acknowledged that distributed generation on a distribution feeder can have impacts at the transmission level, no attempt was made to evaluate the impacts of DER implemented at the distribution level on the transmission level, or to assess the potential for improving network performance through interactions between feeders.

Two generator additions were simulated on a single distribution feeder, analyzed as an isolated facility. The results showed that these additions could reduce losses and correct instances of overvoltage and undervoltage.

This analysis considered the distribution feeder as a standalone facility; it did not consider or anticipate a method or approach where the distribution feeder was incorporated with other feeders and transmission facilities in a larger network. This study's approach therefore could not consider how these additions could affect conditions at the transmission level or elsewhere in the network, nor could it directly assess the merits of capacity additions on the feeder vs. capacity additions at the transmission level or elsewhere in the network.

This work was performed as a demonstration of a particular software package's suitability for such analysis, not as a demonstration of a methodology to assess the potential for a variety of DER devices (generation, dispatchable load sheds, and capacitors) to achieve an overall improvement in power quality and losses in an integrated T&D network.

In *Applications Guide: Distribution Capacity Planning With Distributed Resources*, EPRI, TR-11468, January, 2000, EPRI characterizes the conventional assessment of DER benefits as the cost of a planned network upgrade that is avoided or deferred by DER capacity, less the cost of that DER capacity. EPRI points out that the limitation of this approach is that the "planned" network upgrade to be avoided or deferred was identified without consideration of DER in the plan.

The Area Investment Strategy Model developed by EPRI for assessing the benefits of DER involves analysis to determine if DER can be incorporated in distribution to minimize the overall cost of capacity required to serve customers. Again, this method focuses the distribution system alone. It also considers DER as a source of incremental capacity only; it does not consider DER as a means to improve system stability or voltage security.

A further limitation of such an approach is that the utility is not the decision-maker for DER projects sponsored by a customer or third party. Moreover, a utility cannot make an informed economic evaluation of customer-sponsored DER projects. The utility cannot determine the value the customer places on the project's customer benefits, particularly as these benefits may include such intangibles as energy cost certainty, independence, or peace of mind. The utility also cannot know the actual DER technology costs the customer has been quoted. Thus, a conclusion under the EPRI methodology that DER additions result in a least cost solution is at best incomplete, and might be incorrect. The EPRI method is not capable of assessing or quantifying the stand-alone benefits of DER to the T&D system.

A thorough assessment of the network benefits of DER requires an evaluation that goes beyond a distribution planning area by itself, or, for that matter, beyond the transmission system by itself. It also requires the consideration of a broad set of factors that DER may affect. A more efficient approach to DER planning is for the utility to determine the potential benefits DER could provide to the utility's system as described, and the nature of projects that would deliver those benefits, independently of customer considerations. Then the utility has the means to promote projects having similar characteristics among its customers (and discourage dissimilar projects). The utility then also has the ability to identify those projects that customers will not pursue but whose value to the system justifies utility investment.

In conclusion, we are aware of no method in the prior art of analyzing T&D networks that provides a thorough, objective assessment of the potential benefits DER may provide to a T&D network. This is due in part to the apparent absence of methods in the prior art that provide a means to directly observe the extent to which problems at the transmission level are caused by or exacerbated by problems at the distribution level (and vice versa). Among other things, this prevents the direct observation of the merit of remedying problems throughout the network close to where they occur, particularly at the distribution level, such as with DER.

The absence of a method that provides a thorough, objective assessment of the potential benefits of DER is also due in part to the apparent absence of methods in the prior art that simultaneously consider a variety of potential DER additions or that appropriately consider the range of impacts of DER.

The absence of a method that provides a thorough, objective assessment of the potential network benefits of DER is also due in part to the apparent absence of methods in the prior art that consider the potential network benefits of DER independently of the other potential benefits of DER.

We are also not aware of any method in the prior art that identifies a specific, theoretical set of DER projects that will improve or maximize performance of the subject T&D network. Further, we are aware of no method that identifies such projects for the purpose of guiding policies, identifying consequential barriers to beneficial projects, or designing DER incentives that share value rather than shift costs to non-participants.

Accordingly, one object of the present invention is to provide a method for providing a thorough assessment of the potential benefits DER may provide to a T&D network. Such benefits may include performance improvement such as the reduction in electrical losses, improvement in system stability and/or power quality. These benefits could also include the deferral or avoidance of system additions that would otherwise be required to reliably serve load.

A further object of the present invention is to provide a method for providing a thorough assessment of the potential benefits DER may provide to a T&D network that considers a variety of DER alternatives interchangeably, not generation, capacitors, or load sheds alone.

This object and the prior object overcome a significant drawback of the prior art in thoroughly assessing the potential T&D benefits of DER that arises from the practice of considering classes of DER individually and/or considering a narrow set of performance measures.

A further object of the present invention is to provide a method for analyzing the T&D network, including but not limited to providing a thorough and objective assessment of the potential benefits DER may provide to a T&D network, that includes a means to directly observe the extent to which problems at the transmission level are caused by or exacerbated by problems on any given distribution feeder (and vice versa).

A further object of the present invention is to provide a method for analyzing the T&D network, including but not limited to providing a thorough, objective assessment of the potential benefits DER may provide to a T&D network, that includes a means to directly consider the merits of remedying problems close to where they occur, whether in the distribution system or in the transmission system, including possibly using DER to remedy problems anywhere in the network.

This object and the prior object overcome a significant drawback in the prior art, particularly as it relates to assessing the benefits of DER to a T&D network, that arises from the analysis of transmission independently of distribution, and vice-versa, and the analysis of distribution feeders individually.

A further object of the present invention is to provide a method for analyzing the T&D network, including the incorporation of DER within the network, that facilitates the evaluation of how these elements should operate and interact under a variety of network conditions.

A further object of the present invention is to provide a method for providing an objective measure of the potential benefits DER may provide to a T&D network, where such measure is independent of non-network considerations such as DER benefits for customers or the environment.

This object enables decision-making relative to T&D network matters, including the design of DER incentives based on network benefits, without the distortion of non-network considerations.

A further object of the present invention is to provide a method for quantifying the potential benefits DER could provide a given network, in both engineering and economic or financial terms.

Quantifying potential T&D network benefits of DER in economic terms enables the transfer of the value associated with such network benefits between stakeholders. This could include, for example, financial incentives for DER projects based on a sharing of the network value such projects create rather than simply shifting costs from one set of customers to another.

A further object of the present invention is to provide a method for characterizing the specific DER projects that realize or approach the potential benefits DER may provide to a T&D network. This characterization would include where within the network particular types of DER would make the greatest contribution.

A thorough, objective assessment of the potential benefits of DER to a T&D network along with knowledge of the nature of projects that achieve those benefits would be of significant economic value to T&D network operators, generally utilities. Such information may reveal the potential for substantial savings in losses, improvements in power quality and/or stability, or the opportunity to defer or avoid costly network improvements.

Such an assessment of potential DER benefits, and the specific projects that would provide them, is of great value to a utility if determined objectively, independent of non-network considerations. A utility cannot accurately incorporate customer economics in its planning, nor can it unilaterally implement purported "least cost" solutions if they include customer-sponsored projects. Using the method of this invention a utility can quantify the potential benefits of DER for its system, and devise incentives that share that value with third parties to encourage beneficial DER projects and capture at least a portion of that potential value.

An objective assessment of the potential benefits of DER to a T&D network and knowledge of the nature of projects that achieve those benefits would permit the identification of those barriers that have the greatest impact on the DER projects with the greatest potential T&D benefit. This knowledge in turn would permit the development of high-impact, targeted policy initiatives to promote beneficial DER.

The method of this invention also has substantial economic value to developers of DER projects and vendors of DER technologies. By identifying an additional set of benefits, an additional beneficiary, and/or additional revenue sources for DER projects, and by facilitating policies that remove barriers to DER projects, this invention opens new markets for DER projects and DER technologies.

The means to analyze the integrated T&D network, with DER incorporated within the network, under a variety of conditions, would have great value to network operators and other stakeholders. The means to analyze the integrated T&D network, with DER incorporated within the network, under a variety of conditions, would permit, for example, identification of DER projects that make the greatest contribution to load-carrying capability of the overall network under peak load conditions, and an operating plan for those projects to provide other benefits under non-peak load conditions. This type of analysis is essential to realizing the potential of such concepts as those described in the Wired Magazine article above.

A method for analyzing the T&D network, including providing an objective assessment of the potential benefits DER may provide to a T&D network, that includes a means to directly observe the extent to which problems at the transmission level are caused by or exacerbated by problems on any given distribution feeder (and vice versa) would have substantial value to network operators by identifying the root causes of problems contributing to substandard network performance.

A method for analyzing the T&D network, including providing an objective assessment of the potential benefits DER may provide to a T&D network, that includes a means to directly consider the merits of remedying problems, where such problems may arise either at the transmission level or at the distribution level, at either the transmission level or at the distribution level would have substantial value to network operators in identifying additional solutions for remedying network problems, solutions that may be more effective and/or less costly to implement.

Such methods also have substantial economic value to developers of DER projects and vendors of DER technologies. An expansion of the understanding of the areas where DER projects may represent potential solutions to network problems would open new markets for DER projects and technologies.

Further objects and advantages of this invention will become apparent from consideration of the drawings and ensuing description.

SUMMARY OF THE INVENTION

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

The present invention provides an improved method for analyzing power systems; in particular, power systems that may incorporate DER. A method according to one embodiment of the present invention provides a thorough determination of the potential for network performance improvement that DER could provide. The method also determines the potential for network performance improvement that DER could provide independently and distinct from other benefits DER may provide. The method also quantifies the network performance improvement in engineering and financial terms, and identifies and characterizes the specific DER projects that would realize that potential improvement in network performance.

This methodology incorporates several distinguishing features:

First, the T&D network is analyzed as a single "Energynet," encompassing distribution as well as transmission elements and with embedded distributed energy resources (DER) at all voltage levels. This overcomes drawbacks in prior methods by providing a means to directly observe the extent to which problems at the transmission level are caused by or exacerbated by problems on any given distribution feeder (and vice versa). This also overcomes drawbacks in prior methods by permitting direct evaluation of network additions implemented close to the sources of problems whether in the distribution system or the transmission system. It also overcomes drawbacks of prior methods by permitting planning, design, and operation decisions for the entire Energynet that take into account the interaction of all elements across the entire network.

Second, the method evaluates multiple classes of DER for their impacts on multiple aspects of network performance—factors affecting stability and power quality in addition to losses or the ability to displace network upgrades. This overcomes drawbacks of prior methods by permitting a more thorough assessment of the impact and potential benefits of DER. This is of particular interest when evaluating potential DER additions where their differences in loss reduction may be small, but they may contribute very differently to stability and power quality.

Third, this methodology introduces the notion of an "optimal" portfolio of DER projects, or the Optimal DER Portfolio. This theoretical portfolio is developed and optimized purely from the standpoint of its network benefits. That is, this portfolio is not influenced by other considerations for DER such as customer benefits or environmental benefits. The Optimal DER Portfolio feature overcomes several limitations of prior methods and provides new information and benefits as discussed below.

The network benefits attributable to the Optimal DER Portfolio represent the greatest potential DER has to improve network performance consistent with the conditions and limitations incorporated in the method.

The individual projects of the Optimal DER Portfolio are the projects that, if implemented in the subject network, would yield the greatest improvement in network performance.

The Optimal DER Portfolio is not a plan to implement, but a guide for utilities to better manage their power systems.

The network benefits the Optimal DER Portfolio projects would provide—that is, network benefits of DER assessed according to the method of this invention—are distinct from, and additive to, benefits of DER projects other than network benefits. The Optimal DER Portfolio thus enables a determination of real DER projects that combine network benefits with other benefits such as benefits to an end-use customer, and thus might be developed at a lower cost to the utility. The Optimal DER Portfolio also enables a determination of those projects that would benefit the system only, and thus must be developed by the utility.

Because the network benefits provided by the Optimal DER Portfolio are distinct from other potential benefits of DER, the Optimal DER Portfolio offers an objective means for identifying, quantifying, and pricing network benefits of DER. Further, it is ideally suited for formulating policies to promote the development of real DER projects based on their potential for direct enhancement of network performance. The Optimal DER Portfolio also is ideal for formulating pricing, tariffs, or financial incentives based on sharing of the value of DER's system benefits with DER developers rather than cost shifting.

The Optimal DER Portfolio projects can also be used to guide policies to promote greater deployment of DER that benefits the T&D network. Identifying the specific projects that provide the greatest network benefits permits, in turn, identification of the most consequential barriers to those projects. These barriers, then, are the ones with the most impact on T&D network improvement and reasonably should receive the most targeted attention.

DETAILED DESCRIPTION OF THE INVENTION

The Figures and the following description relate to preferred embodiments of the present invention by way of illustration only. It should be noted that from the following discussion, alternative embodiments of the methods disclosed herein will be readily recognized as viable alternatives that may be employed without departing from the principles of the claimed invention.

Figure 1:
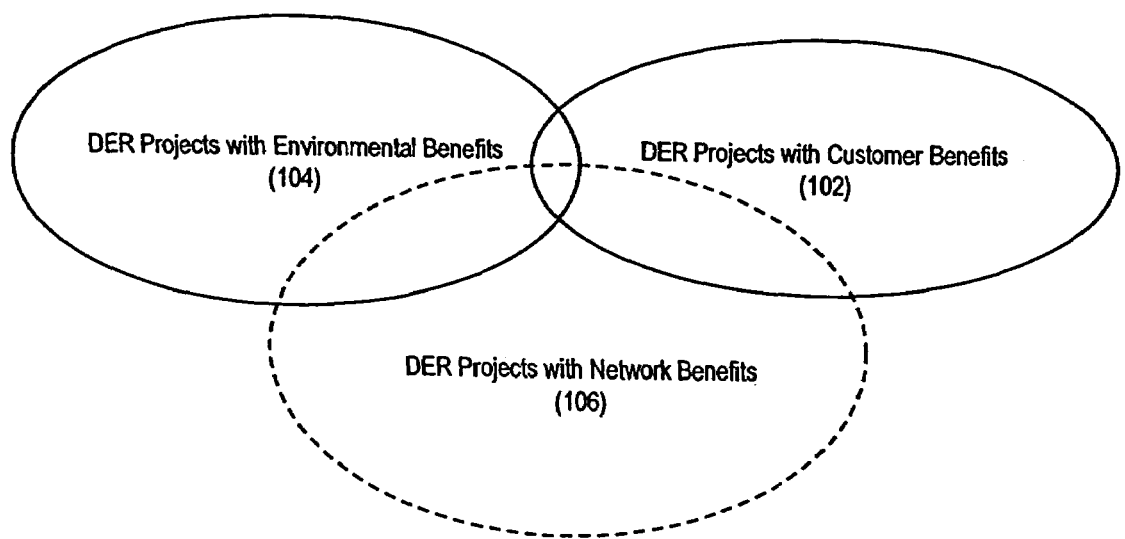
FIG. 1 is a Venn diagram illustrating one purpose of a method according to one embodiment of the present invention.

FIG. 1 is a Venn diagram illustrating one purpose of a method according to one embodiment of the present invention; specifically the determination of potential network benefits of DER as distinct from benefits of DER for customers or environmental benefits of DER, and the specific DER projects that provide such grid benefits.

Space 102 represents those DER projects that provide benefits to end-use electricity customers. These benefits might be reduced energy cost or increased reliability. Space 102 is characteristic of the customers served by the T&D network. Methods for identifying the DER projects in Space 102 and the potential benefits of these projects are well-known in the art.

Space 104 represents those DER projects that provide benefits to the environment. These benefits might be reduced emissions, or greater fuel-use efficiency, or use of a waste for fuel. Space 104 is characteristic of the technologies available for deployment within the T&D network. Methods for identifying the DER projects represented in Space 104 are well known in the art.

Space 106 represents those DER projects that provide benefits to the performance of the T&D network. These benefits might be reduced losses, improved stability or voltage security, improved power quality, improved load-serving capability, or the opportunity to forego or defer improvements to the network that would otherwise be required to adequately serve loads. The potential network benefits achieved and the specific DER projects that achieve them are characteristic of the T&D network itself. According to one embodiment of the present invention, a method concerns itself in part with assessing the magnitude and value of the potential network benefits DER projects in Space 106 represent, and identifying nature of those projects—the Optimal DER Portfolio projects.

Preparing the Energynet Datasets

A method according to one embodiment of the present invention overcomes significant drawbacks of previous T&D network analysis methods, particularly as they relate to assessing the network impact or potential network benefits of DER, by performing mathematical simulation of the subject network using a dataset that combines transmission and distribution elements and their interconnection together, as a single integrated network. This simulated network has the capability to incorporate additions of real capacity, reactive capacity, and real and reactive capacity together as real and reactive energy sources, e.g., generators, capacitors, dispatchable demand, and the like, embedded within the network at either distribution or transmission voltage levels, as needed. We refer to a network so described as an Energynet and such a dataset as an Energynet dataset.

According to one embodiment of the present invention, real capacity or energy source, reactive capacity or energy source, and real and reactive capacity or energy source together may represent dispatchable demand reductions, capacitors, generators and the like. Accordingly, the Energynet may also refer to a transmission and distribution system, combined as a single network that incorporates dispatchable demand reduction, capacitors, and generation, all of which may be analyzed and managed as an integrated system.

According to one embodiment of the present invention, the Energynet dataset would include the following: For the transmission portion of the subject network, generating stations interconnected at transmission voltage level(s), impedances and interconnections of transformers and transmission lines, impedances of loads interconnected at transmission voltage level(s), and sources of reactive power such as synchronous voltage condensers and capacitor banks. For the distribution portion of the subject network, the Energynet dataset would include impedances of distribution transformers, transmission-to-distribution stepdown transformers, impedances of distribution lines, impedances of loads interconnected at distribution voltage level(s), the interconnection of lines and transformers, and sources of reactive reserves such as synchronous voltage condensers and capacitor banks. The distribution portion of the system would also include generating stations interconnected at distribution voltage level(s), taking into consideration their capacity to provide reactive power, loads that may be curtailed by the network operator on demand, and interconnections such as those on looped distribution radials that may be switched, along with the switch positions normally used under different operating conditions.

The use of such an Energynet dataset overcomes many of the disadvantages of traditional analysis methods used for transmission systems or distribution systems, in particular their disadvantages as they relate to assessing the impact of DER. Analysis using an Energynet dataset permits the direct observation of the extent to which problems at the transmission level of the network arise from or are exacerbated by problems at the distribution level (and vice versa). Analysis using an Energynet dataset also permits direct analysis of the merits of remedying problems at either the transmission or the distribution level with changes at either level; in particular, the merits of DER additions at the distribution level to remedy problems of the overall network.

Figure 2:
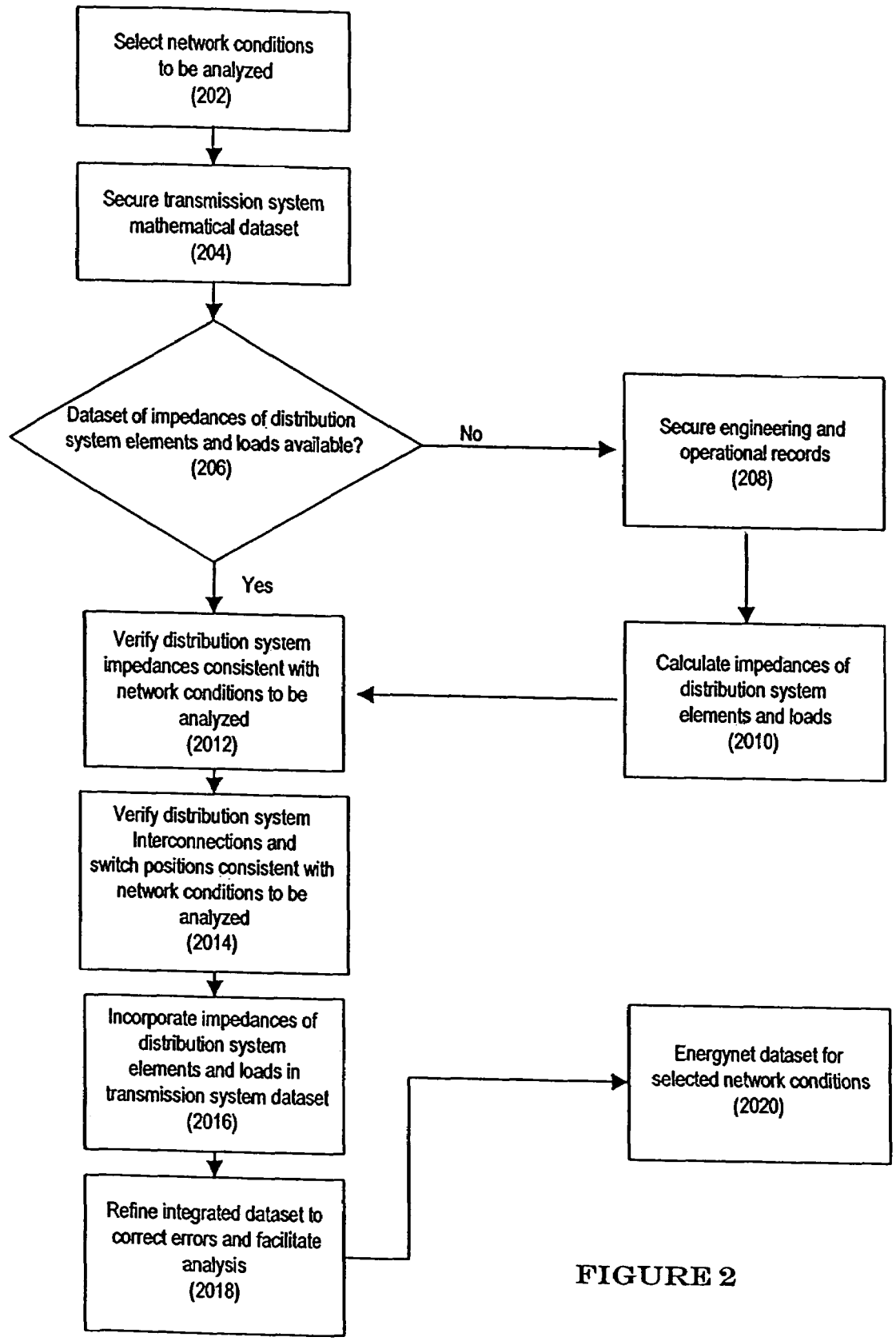
FIG. 2 is a flowchart illustrating the creation of an Energynet dataset according to one embodiment of the present invention

FIG. 2 is a flowchart illustrating the creation of an Energynet dataset set of network conditions according to one embodiment of the present invention. An Energynet dataset so created would specific to a given set of network conditions, e.g. Summer Peak in a given year, as represented by Block 202.

According to one embodiment of the present invention, creating this Energynet dataset begins with an existing dataset incorporating the elements of the transmission system that may be read and interpreted by a commercially-available "load flow" computer program traditionally used in the art for analyzing transmission systems. Elements of the distribution feeders of the subject network are then added to the dataset as described below. In general, utilities or transmission system operators have such transmission load flow datasets available as they are commonly used in the art for transmission planning. In Block 204 such a transmission load flow dataset consistent with the conditions to be analyzed is secured.

As represented by Block 206, in some cases utilities may also have impedances of loads and elements of their distribution feeders available in a compatible dataset format for combination with the transmission dataset. In Block 2012 these distribution data are evaluated by one skilled in the art to ensure the conditions they represent are consistent with the network conditions to be analyzed and the conditions represented by the transmission dataset. For example, one skilled in the art would exercise ordinary judgment to ensure that the distribution-level data chosen for incorporation in an Energynet dataset that begins with a Summer Peak transmission dataset represent conditions that are consistent with the Summer Peak conditions reflected in the transmission data.

If impedances of the loads and elements of the distribution feeders are not directly available, information from engineering design documents and operational records such as SCADA records, circle charts, and operational records obtained in Block 208 can be used by those skilled in the art to derive the distribution element and load impedances needed to develop the Energynet dataset, as in Block 2010.

The following describes the process in Block 2010 in more detail:

Impedances of the transmission-to-distribution stepdown transformers under the conditions to be modeled may be determined from recorded circle charts.

Individual feeder currents under the conditions to be modeled may be taken from SCADA records.

The total impedance of each feeder can be calculated from this information.

The impedance of the elements of each feeder may then be then calculated from engineering design records for the feeder (e.g. line length and construction and details of other feeder elements).

The each feeder's total load impedance can then be derived as the difference between the calculated total impedance and the feeder element impedance.

Impedances of individual loads on a given feeder can be estimated using transformer ratings taken from engineering records.

Again, in Block 2012 one skilled in the art ensures that the operational records used to calculate the feeder element and load impedances are consistent with the network conditions to be analyzed and the conditions represented by the transmission dataset.

In Block 2014 the interconnection of distribution elements and the normal switch settings for the switchable looped radial feeders are obtained from engineering and operational records and verified by one skilled in the art to be consistent with the network conditions to be analyzed. For example, for an Energynet dataset depicting Summer Peak conditions, one skilled in the art would use judgment to ensure that switch positions are modeled as appropriate for those conditions.

In Block 2016 the available distribution element and load impedances and interconnections are incorporated in the transmission dataset, according to the means of the particular load flow program selected for analyzing the dataset for adding or appending data to a dataset.

It should be noted that commercially-available load flow programs are traditionally used in the art for analyzing transmission systems. Accordingly, the addition to a transmission load flow dataset of information representing distribution feeders may represent the addition of a large number of new elements into the dataset and/or dramatically increase the total number of elements in the dataset. It may be burdensome to add these data, and the new elements may increase the computational complexity of analyzing this Energynet dataset. A method according to an alternative embodiment of the present invention that is appropriate for an analysis that focuses primarily on DER capacity additions may involve incorporating in the Energynet dataset only the distribution feeders that are likely sites for DER. This could allow the exclusion of secondary distribution feeders and/or the exclusion of those feeders serving primarily or only residential areas. The potential for on-site generation at residences and the opportunity evaluate and improve the operation of all the distribution portions of the network suggests some drawbacks of excluding portions of the network from the Energynet simulation.

It should also be noted that incorporating distribution and transmission elements in a single Energynet dataset increases the potential for the presence of elements with very low impedances, such as short lines, and/or elements having very different impedances in close proximity. These considerations may introduce challenges for some existing load flow programs designed primarily to analyze transmission systems, and/or some programs may be unable to distinguish between valid data and errors. In Block 2018 those skilled in the art use judgment to combine elements to eliminate problematic low impedance elements without affecting the overall results, or use the operational features of the selected load flow program to adjust the error-checking features or the performance parameters of the program to facilitate solutions with the added distribution data or to change the precision the program uses to identify acceptable solutions.

According to one embodiment of the present invention, the Energynet dataset, once constructed, is analyzed using a computer programmed with one or more load flow programs similar to those traditionally used in the art for analyzing transmission systems. Load flow programs are used initially to characterize the condition of the Energynet "as found," or prior to any changes according to the method. Load flow programs are also used to evaluate the impact on the condition of the Energynet of any changes to the Energynet; in particular, the addition of DER capacity anywhere in the network as described below.

Given the availability of a variety of commercially-available load flow programs in the art, the selection of the program to be used may impact the format required for the Energynet dataset, its contents, and the types of adjustments required in Block 2018. Alternatively, a new format may be developed specifically for a new load-flow program developed according to one embodiment of the present invention.

Block 2020, the result of the foregoing process, is an Energynet dataset that represents the subject network under the selected conditions and that is compatible with the selected load flow program.

In Block 302, analysis of the resulting Energynet dataset of Block 2020 using the selected load flow program yields a characterization of the integrated transmission and distribution network under the conditions selected for analysis as a "base case," i.e. before the addition of DER capacity.

Such load flow tools will characterize the power flows, losses, voltage profile, and power factor within the integrated transmission and distribution network represented by the Energynet dataset, in this case before the addition of any DER.

Some analysis tools known in the art have the capability to evaluate (not just characterize) the voltage profile of the network being analyzed and/or determine the proximity to voltage collapse or the voltage security of the network. If such analysis tools are applied to an Energynet dataset according to one embodiment of the present invention, results will include an evaluation of the voltage profile and/or the proximity to voltage collapse or voltage security across the transmission and distribution portions of the integrated network represented by the Energynet dataset.

According to one embodiment of the present invention, several Energynet datasets are developed, each representing the subject network under a different set of conditions. Different Energynet datasets for different system conditions may be prepared by making appropriate modifications to one Energynet dataset that incorporates transmission and distribution elements prepared as described above.

Developing DER Capacity Additions

A method according to one embodiment of the present invention provides the ability to determine the potential improvement in network performance available through deployment of DER by evaluating potential additions of real power generating capacity, reactive capacity, or real and reactive capacity together, interchangeably as potential DER capacity additions to improve network performance. According to one embodiment of the present invention, such DER capacity additions may be applied anywhere within the Energynet, at any voltage, in any combination.

According to one embodiment of the present invention, potential additions to the Energynet of such DER capacity are evaluated for their ability to improve network performance. Such DER capacity additions are evaluated for their impact on a variety of factors, including reducing losses, improving power quality and improving system stability and voltage security.

According to one embodiment of the present invention, additions of real and reactive power together represent power generators with synchronous condensers. Additions of real power alone represent dispatchable demand reductions. Additions of reactive power alone represent capacitors.

The method of the present invention thus permits a comprehensive evaluation of all the possibilities in terms of DER capacity additions, as well as the interplay between them, and permits consideration of the impact of different potential DER additions on a broad set of network performance criteria.

Figure 3:
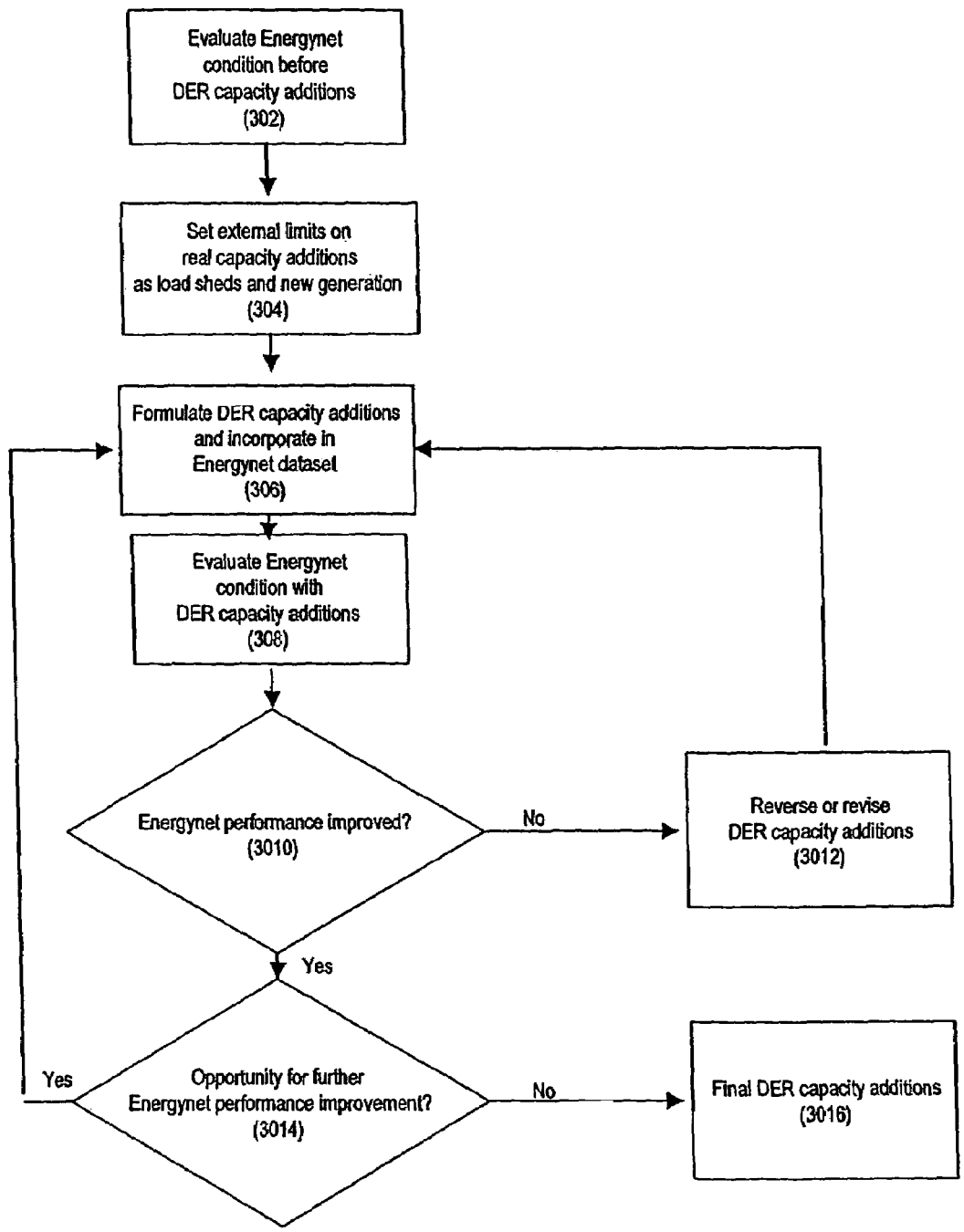
FIG. 3 is a flowchart illustrating the process for identifying the DER capacity additions that underlie that set of DER projects that provide the maximum potential for improvement in network performance according to one embodiment of the present invention.

FIG. 3 is a flowchart illustrating this process According to one embodiment of the present invention.

According to one embodiment of the present invention the evaluation of the impact of particular DER capacity additions is performed by comparison, in Block 3010, of network performance with the DER capacity additions (Block 308) with network performance without those DER capacity additions (Block 302) using the selected analytical tools.

In Block 306 alternative DER capacity additions, or combinations of additions of real capacity, reactive capacity, and/ or real and reactive capacity together are formulated and incorporated into the Energynet model by one skilled in the art.

Under an alternative embodiment of the present invention, one skilled in the art formulates proposed DER capacity additions to improve system performance in an ad hoc fashion. This process is similar to the process described as background art by Schleuter for identifying system improvements in the system planning of transmission systems; however, in this case the potential improvements are expanded to include real and reactive capacity at locations within either the distribution or transmission portions of the network.

Under another alternative embodiment of the method of the present invention, proposed DER capacity additions are formulated by or with the assistance of software tools known in the art having the capability to determine where additional real or reactive capacity is needed based on an analysis of the network condition.

In Block 308 the condition of the updated Energynet model is re-assessed using the selected load flow tools. In Block 3010 the results are evaluated by comparison with the Energynet conditions prior to the addition of such DER capacity additions. According to one embodiment of the present invention, these results are evaluated to determine if the DER capacity additions result in reduced-losses, improved power quality, and improved network stability and voltage security.

Under an alternative embodiment of the present invention the updated Energynet datasets are evaluated using analytical tools known in the art to directly evaluate voltage security, or proximity to voltage collapse, such that DER capacity additions may be evaluated directly for the improvement in voltage security they offer.

Other analytical tools may provide more revealing comparisons of Energynet conditions and illustrate with greater precision the changes in Energynet conditions resulting from the DER capacity additions.

According to one embodiment of the present invention, the foregoing process of formulating DER capacity additions in Block 306 and assessing their impact in Blocks 308 and 3010 is repeated until it appears to one skilled in the art in Block 3014 that further DER additions will not yield meaningful performance improvement based on the observation of successive sets of results.

In Block 3012 DER capacity additions that do not improve Energynet performance are revised or reversed.

It is reasonable to expect that any and all additions of real capacity within the Energynet may be shown to yield an improvement in performance due to the reduction in losses. Thus, in Block 304 external limits are placed on potential additions of new real capacity, either in the form of additions of dispatchable demand reduction or in the form of new generating capacity. Additions of dispatchable demand reductions may be limited based on an assessment of the types of customers represented in the Energynet model; particularly the willingness of such customers to provide such dispatchable demand reductions, as determined through past practice by one experienced in the art. Additions of new generating capacity are limited by an assessment of the technical limits of the distribution feeders represented in the Energynet model to accommodate such new generating capacity, as determined by one knowledgeable in the art.

Following an evaluation of a variety of alternative DER capacity additions as described above, Block 3016 results in a set of additions of real capacity, reactive capacity, and real and reactive capacity together that, based on an evaluation of alternatives, yields the greatest reduction in losses, improvement in power quality, and improvement in network stability and voltage security.

It should be noted that a transmission system, even a relatively large one, realistically must consider only a small number of potential additional generating plants. However, even a small T&D network represented as an Energynet may have a great many potential DER capacity additions that must be considered and evaluated for the network benefits they provide. Accordingly, the iterative process from Block 306 through either Block 3012 or 3014 and back may be laborious.

Network analysis tools in the art may exist or emerge with the capability to determine with greater precision the locations in the network where such DER capacity additions will reduce losses, improve power quality, and/or improve system stability and voltage security. Such tools used within a method according to one embodiment of the present invention will yield results having greater accuracy and repeatability more quickly.

Characterization of DER Capacity Additions as DER Projects

According to one embodiment of the present invention, the set of DER capacity additions determined in Block 3014, as real capacity additions, reactive capacity additions, and additions of real and reactive capacity together, are now characterized as specific DER projects in an Optimal DER Portfolio.

As further described below, these DER projects may be characterized in terms of their type, size, location within the network, operating profile under varying network conditions, and when they must be added to the network to match anticipated changes in network conditions.

Figure 4:
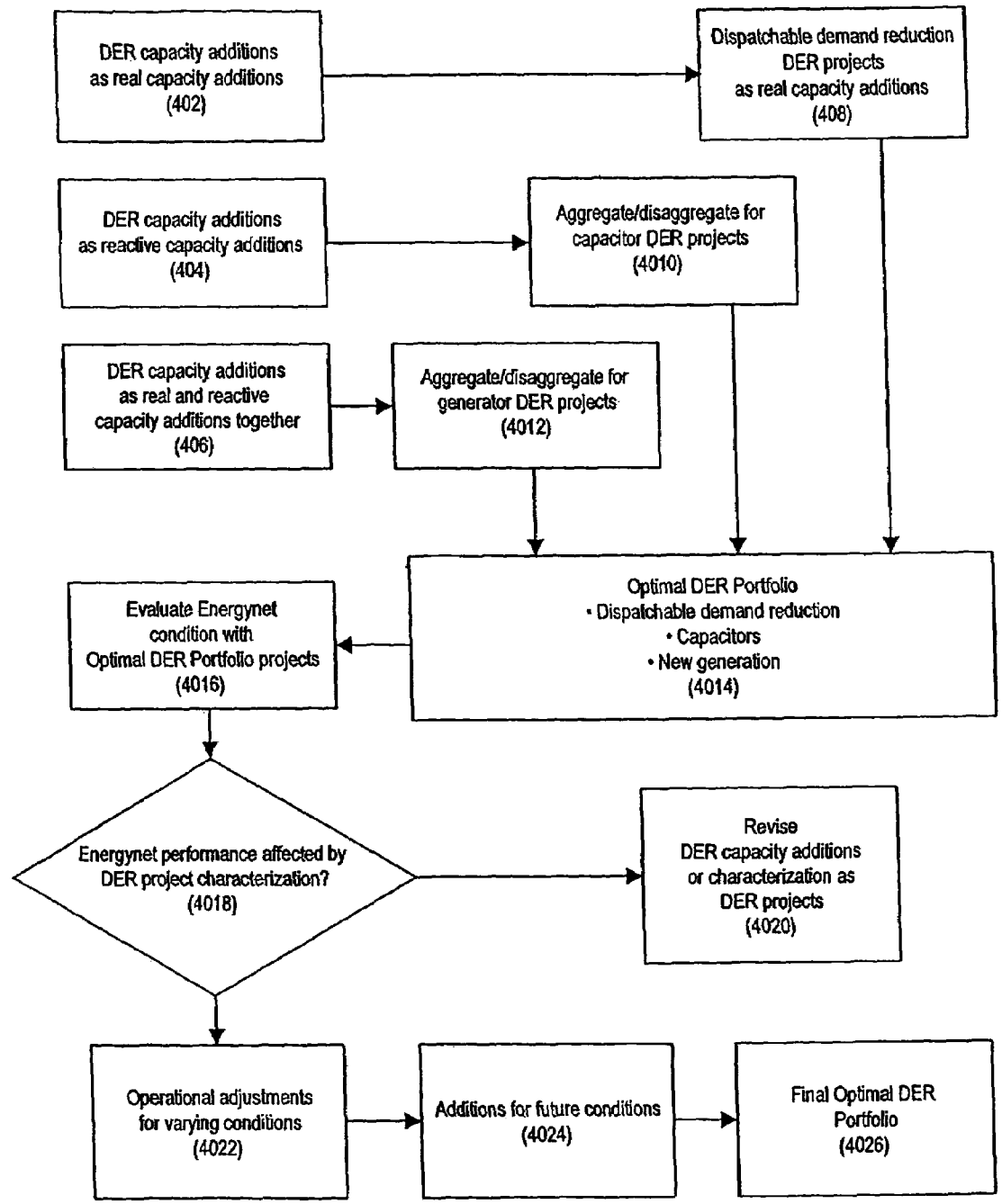
FIG. 4 is a flowchart illustrating the process for characterizing DER capacity additions as Optimal DER Portfolio projects according to one embodiment of the present invention.

FIG. 4 is a flowchart of this process According to one embodiment of the present invention.

According to one embodiment of the present invention, additions of real and reactive power together (Block 406) represent power generators with synchronous condensers. Additions of real power capacity alone (Block 402) represent dispatchable demand reductions (Block 408). Additions of reactive capacity (Block 404) represent capacitors.

In an alternative embodiment of the present invention, additions of real power Capacity alone (Block 402) may also represent power generators with inverters.

In Blocks 4010 and 4012 DER capacity additions are aggregated or disaggregated as appropriate to match the sizes of capacitors and generating units, respectively, known to be available.

In Block 4016, the Energynet dataset is updated to reflect such aggregation or disaggregation, and a determination is made in Block 4018 by one skilled in the art, using the selected analytical tools as described above, of whether such aggregation or disaggregation yields network performance that is acceptably close to the performance achieved before such aggregation or disaggregation. In Block 4020 revisions are made as appropriate.

In Block 4022 this process yields a list of generators, capacitors, and dispatchable demand reductions, or load sheds, that are demonstrated to yield the greatest improvement in the performance of the subject network, specifically as reduced losses, improved power quality, and improved system stability or voltage security. These generators, capacitors, and dispatchable demand reductions are individually characterized in terms of their size and their interconnection point within the network.

It should be noted that this list of projects, developed as described, is demonstrated to yield the greatest improvement in network performance only under a single set of conditions.

Under the preferred embodiment of the present invention Energynet datasets are prepared a variety of different system conditions according to the process described above and illustrated in FIG. 2. In addition, different sets of capacity additions that achieve the greatest network performance improvement under the different sets of conditions are developed according to the process described above and illustrated in FIG. 3.

Alternatively, a single set of DER capacity additions developed as described above is tested under different system conditions and adapted if necessary to achieve a high level of improvement in network performance.

In Block 4022, differences in the various DER capacity additions developed for the various system conditions, or, the adaptations to the single set of DER capacity additions for different conditions, are reflected in the Optimal DER Portfolio as follows:

Different real capacity additions under different system conditions represent dispatch schemes for dispatchable demand reductions in the Optimal DER Portfolio.

Different reactive capacity additions may be accommodated to some extent by variable or switchable capacitors in the Optimal DER Portfolio.

Different real and reactive capacity additions together may be accommodated to some extent in dispatch schemes for generators in the Optimal DER Portfolio.

Under a preferred embodiment of the present invention, one or more Energynet datasets are prepared to reflect system conditions in the future, particularly incorporating load growth, as described above and illustrated in FIG. 2. Next, sets of DER capacity additions that achieve the greatest network performance improvement under those future conditions are developed as described above and illustrated in FIG. 3. Next, these DER capacity additions are characterized as Optimal DER Portfolio projects, as described above and illustrated in FIG. 4. In Block 4024 those additional Optimal Portfolio DER projects that must be added to accommodate future conditions are identified, along with when they must be operational.

The result, in Block 4026, is the Optimal DER Portfolio for the subject network. This Optimal DER Portfolio is a list of DER projects, specifically dispatchable demand reduction, capacitors, and generation. These projects are characterized in terms of their size, location in the network, operating profile, and when they must be operational. These projects offer the greatest potential for network performance improvement given the conditions and limitations of the analysis.

Figure 5:
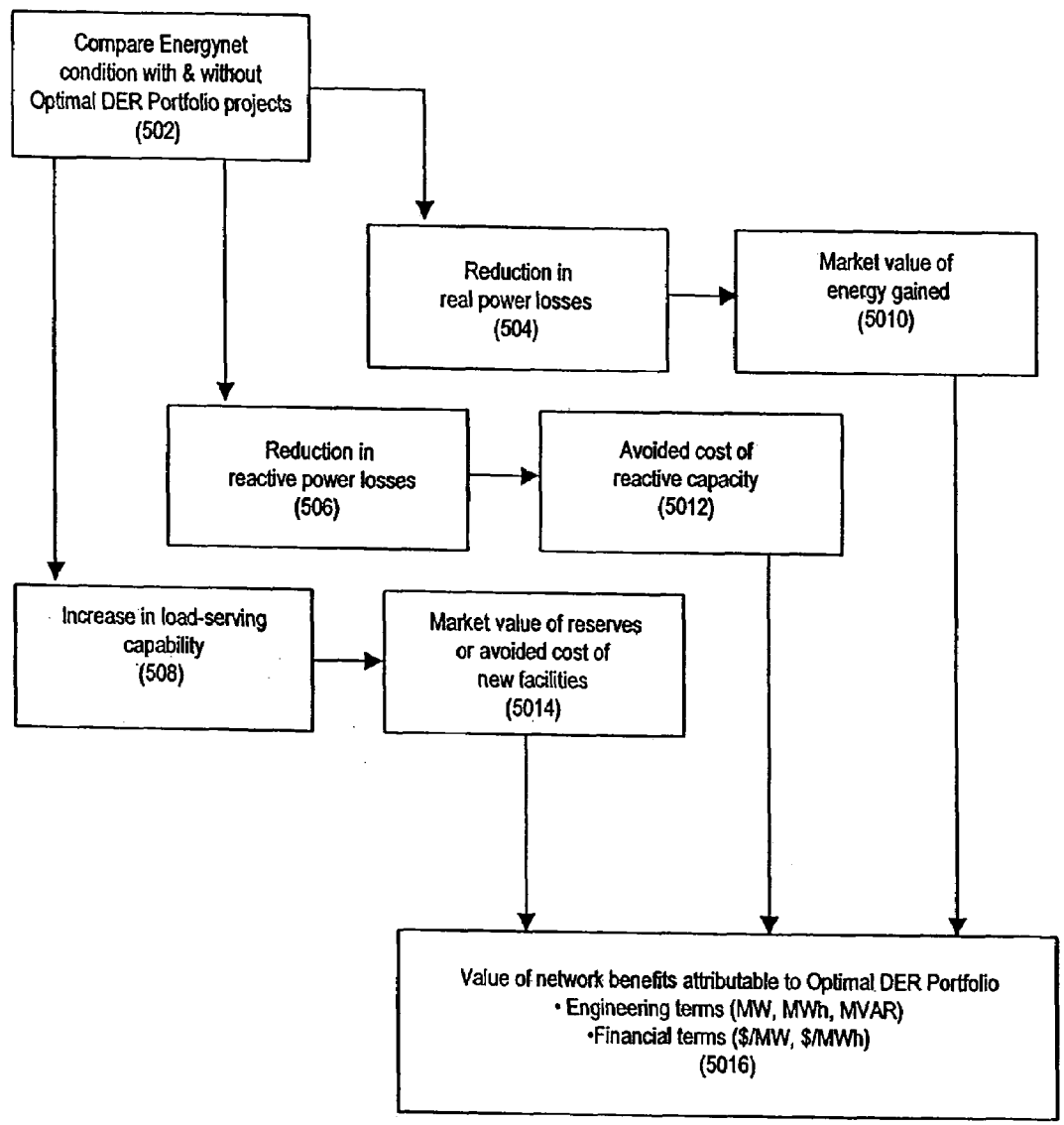
FIG. 5 is a flowchart illustrating the process of quantifying the network benefits provided by the Optimal DER Portfolio projects according to one embodiment of the present invention.

Quantification of Network Benefits Attributable to Optimal DER Portfolio Projects According to one embodiment of the present invention, the value of the potential network benefits yielded by the Optimal DER portfolio is determined. FIG. 5 is a flowchart illustrating this process.

In Block 502 the condition of the Energynet with and without the Optimal DER Portfolio projects is compared using the selected analytical tools.

According to one embodiment of the present invention, the improvement in system stability and voltage security is evaluated qualitatively by one skilled in the art by observing the voltage profiles in the Energynet load flow results with and without the Optimal DER Portfolio projects.

According to another embodiment of the present invention, the improvement in system stability and voltage security is assessed more rigorously by performing stability studies upon the Energynet datasets with and without the Optimal DER Portfolio projects using methods well known in the art.

According to yet another embodiment of the present invention, an analytical tool with the capability to directly assess voltage security or proximity to voltage collapse is used. This permits a direct measurement of the change in voltage security or the change in proximity to voltage collapse by comparing the Energynet with and without the Optimal DER Portfolio projects.

In Block 504 the aggregate reduction in real power losses attributable to the Optimal DER Portfolio projects is readily observable from the results from Block 502. In Block 506 the aggregate reduction in reactive power losses attributable to the Optimal DER Portfolio projects is readily observable from the results from Block 502.

According to one embodiment of the present invention, Energynet datasets corresponding to different network conditions are prepared as described above. Thus, the variation in network performance improvement achieved by the Optimal DER Portfolio projects under different network conditions may be assessed by comparing results for Energynet datasets corresponding to those different network conditions with and without the Optimal DER Portfolio projects, incorporating the operational adjustments and dispatch schemes developed in Block 4022.

In Block 508 the increase in the network's load-serving capability attributable to the Optimal DER Portfolio projects is evaluated. According to one embodiment of the present invention, the increase in load-serving capability of the Energynet attributable to the Optimal DER Portfolio projects is determined by increasing loads in the Energynet datasets with and without the Optimal DER Portfolio projects to the point of overload, according to conventional method in the art.

Under another embodiment of the present invention, the increase in load-serving capability of the Energynet attributable to the Optimal DER Portfolio projects is assessed by comparing the performance of the Energynet using datasets reflecting expected future conditions, with load growth, with the Optimal DER Portfolio projects on one hand and, on the other hand, with network improvements otherwise contemplated to accommodate these expected future conditions.

According to one embodiment of the present invention, any of these assessments of the Energynet performance with and without the Optimal Portfolio projects are also made for groups of Optimal DER Portfolio projects or individual projects from the Optimal Portfolio. It should be noted that because the impact of elements of the network may be closely coupled, it does not necessarily follow that the performance improvement attributable to the Optimal Portfolio as a whole equals the sum of the performance improvement attributable to groups of Optimal Portfolio projects or individual projects.

According to one embodiment of the present invention, the network performance improvement attributable to the Optimal DER Portfolio projects is now assessed in financial terms.

In Block 5010, according to one embodiment of the present invention reductions in real power losses attributable to the Optimal DER Portfolio projects are valued based on the spot market value of the energy gained.

In Block 5012, according to one embodiment of the present invention reductions in reactive power losses attributable to the Optimal DER Portfolio projects are valued based on the cost of capacitors that would be required to provide the same amount of reactive power.

In Block 5014 according to one embodiment of the present invention increases in the load-serving capability of the Energynet attributable to the Optimal DER Portfolio projects are valued based on the cost of traditional network additions, such as wires and transformers, that would be required to serve the same load. Under another embodiment of the method of the present invention increases in the load-serving capability of the Energynet attributable to the Optimal DER Portfolio projects are valued based on the market value of reserves that are effectively created.

Increases in system stability or voltage security are not directly priced, but are indirectly reflected in the value associated with reduced real and reactive power losses and increased load-serving capability.

REFERENCE NUMERALS

102 DER with customer benefits
104 DER projects with environmental benefits
106 DER projects with network benefits
202 selection of network conditions for analysis
204 transmission dataset
206 determination of availability of impedances of loads and elements of distribution feeders from compatible dataset
208 engineering and operational data
2010 derivation of impedances of loads and elements of distribution feeders derived from engineering and operational data
2012 evaluation to ensure consistency of distribution data and transmission data
2014 incorporation and verification of distribution element interconnections and switch positions
2016 incorporation of distribution impedance data with transmission data
2018 adjustments to combined dataset
2020 Energynet dataset representing subject network under the selected conditions
302 characterization of integrated transmission and distribution network under the conditions selected for analysis before addition of DER.
304 external limits on real capacity additions
306 formulation and incorporation of alternative DER capacity additions
308 reassessment of dataset with DER additions
3010 comparison of Energynet performance with base case
3012 revision of DER capacity additions that do not improve Energynet performance
3014 determination if further DER additions will yield meaningful performance improvement
3016 DER capacity additions yielding the greatest evaluated reduction in losses, improvement in power quality, and improvement in network stability and voltage security.
402 real capacity DER additions representing dispatchable demand reduction
404 reactive capacity DER additions representing capacitors
406 DER additions of real and reactive power capacity together representing power generators
408 dispatchable demand reduction DER projects
4010 aggregation or disaggregation of reactive capacity additions into for DER projects matching available capacitors
4012 aggregation or disaggregation of additions of real and reactive capacity together into DER projects matching available power generators
4014 provisional Optimal DER Portfolio projects
4016 update of Energynet dataset for aggregated or disaggregated capacity
4018 determination of any significant impacts of aggregation or disaggregation on Energynet performance
4020 appropriate revisions to Energynet dataset and capacity additions
4022 operational adjustments and dispatch schemes for Optimal DER Portfolio projects
4024 DER projects to accommodate future conditions
4026 final Optimal DER Portfolio for the subject network
502 comparison of Energynet condition with and without the Optimal DER Portfolio projects
504 determination of aggregate reduction in real power losses attributable to the Optimal DER Portfolio projects
506 determination of aggregate reduction in reactive power losses attributable to the Optimal DER Portfolio projects
508 determination of increase in the network's load-serving capability attributable to the Optimal DER Portfolio projects
5010 valuation of reductions in real power losses attributable to Optimal DER Portfolio projects
5012 valuation of reductions in reactive power losses attributable to Optimal DER Portfolio projects
5014 valuation of increase in network's load-serving capability attributable to Optimal DER Portfolio projects
5016 engineering and economic valuation of network benefits attributable to Optimal DER Portfolio projects As indicated above, Space 106 of FIG. 1 represents those DER projects that provide benefits to the performance of the T&D network. The set of DER projects represented by Space 106 is distinct from the set of DER projects represented by Space 104, those projects with environmental benefits. The set of DER projects represented by Space 106 is distinct from the set of DER projects represented by Space 102, those projects with benefits for customers.

There may be, and likely are, DER projects that benefit the subject T&D network and also benefit either the environment, customers, or both. In operation, an objective identification of those DER projects that benefit the T&D network, apart from the influence of customer or environmental considerations according to the method of this invention, is a necessary precursor to identifying those projects that share that attribute with other benefits.

The method of the present invention involves the preparation of an Energynet dataset, as described above and illustrated in FIG. 2. The Energynet dataset for the subject T&D network is an integrated mathematical representation of integrated transmission and distribution elements and their interconnection, with the capability to incorporate additions of real capacity, reactive capacity, and real and reactive capacity together at any point in the network. Block 2020 of FIG. 2 represents the Energynet dataset for the subject T&D network for a particular set of conditions.

In operation, the use of such an Energynet dataset overcomes many of the disadvantages of traditional analysis methods used for transmission systems or distribution systems, in particular their disadvantages as they relate to assessing the impact of DER. Analysis using an Energynet dataset permits the direct observation of the extent to which problems at the transmission level arise from or are exacerbated by problems at the distribution level (and vice versa), and the merits of remedying problems at either the transmission or the distribution level with changes at either level; in particular, the merits of DER additions at the distribution level to remedy problems of the overall network.

According to one embodiment of the present invention, the Energynet dataset, once constructed, is analyzed using a suitably programmed computer incorporating commercially-available "load flow" programs traditionally used in the art for analyzing transmission systems. These tools are used initially to characterize the condition of the Energynet "as found," or prior to any changes according to the method. These tools are also used to evaluate the impact on the condition of the Energynet of any changes to the Energynet; in particular, the addition of DER capacity anywhere in the network as described below.

In Block 302, analysis of the resulting Energynet dataset of Block 2020 using load flow tools yields a characterization of the integrated transmission and distribution network under the conditions selected for analysis.

Such load flow tools will characterize the power flows, losses, voltage profile, and power factor within the integrated transmission and distribution network represented by the Energynet dataset, in this case before the addition of any DER.

Some power system analysis tools may have the capability to evaluate (not just characterize) the voltage profile of the network being analyzed and/or determine the proximity to voltage collapse or voltage security of the network being analyzed. If such analysis tools are applied to an Energynet dataset according to the method of this invention, results will include an evaluation of the voltage profile and/or the proximity to voltage collapse or voltage security across the transmission and distribution portions of the integrated network represented by the Energynet dataset.

In operation, one benefit of the method of this invention is that load flow results from an Energynet dataset will reveal the extent to which deficiencies known at the transmission level are actually the accumulation of deficiencies at the distribution level, as well as reveal new deficiencies within the distribution portion of the network that only reveal themselves through this type of analysis.

Further, evaluation of the load flow results for the integrated Energynet dataset by those skilled in the art may identify different settings for control variables that will yield improved network performance.

Developing several Energynet datasets representing the integrated network under a variety of conditions (or alternatively, developing Energynet datasets for different system conditions by modifying one Energynet dataset) permits the observation of the conditions of the entire network under changing circumstances. This, in turn, permits the development of control schemes and procedures that more thoroughly respond to conditions throughout the network. This also readily permits an evaluation of the merits of automated network controls, more comprehensive monitoring of network conditions, and more sophisticated demand management schemes.

Because the Energynet dataset includes representations of any looped distribution feeders with switchable connections, The Energynet dataset provides the means to readily evaluate the merits of switching the feeders serving particular loads under different operating conditions.

In operation, use of the Energynet dataset prepared as described above and represented by Block 2020 to develop a set of DER capacity additions as described above and represented by Block 3014 permits a comprehensive evaluation of all the possibilities in terms of DER capacity additions, as well as the interplay between them, in all parts of the subject network, and permits consideration of the impact of different potential DER additions on a broad set of network performance criteria.

As described above, potential DER capacity additions include additions of real capacity, additions of reactive capacity, and additions of real capacity together with reactive capacity. These are evaluated as interchangeable alternatives.

Alternative DER capacity additions are evaluated for their impact on losses in the subject network, but also for their impact on factors affecting power quality and network stability or voltage security. In practice, small differences in the DER capacity additions considered may affect their impact on these other factors.

The method of the present invention may be carried out with any one of a number of commercially-available transmission network analysis tools known in the art. The minimum requirement is that they be capable of characterizing the Energynet dataset under a given set of conditions. However, the enormous range of possibilities and flexibility inherent in alternative DER capacity additions places new demands on these tools—demands that are not evident in traditional transmission system analysis.

Network analysis tools capable of detecting and quantifying differences between many different sets of DER capacity additions, particularly in terms of their impact on network stability and voltage security, will yield better results more quickly when applied under the methodology of this invention.

According to one embodiment of the present invention, the set of DER capacity additions determined in Block 3014, as real capacity additions, reactive capacity additions, and real and reactive capacity additions together, are characterized as specific DER projects in an Optimal DER Portfolio, as described above. The result, in Block 4026, is the Optimal DER Portfolio for the subject network.

The Optimal DER Portfolio is a list of DER projects, specifically dispatchable demand reduction, capacitors, and generation. These projects are characterized in terms of their size, location in the network, and when they must be operational. They are also characterized in terms of how they should operate under different conditions. This set of projects offer the greatest potential for network performance improvement given the conditions and limitations of the analysis.

This element in the method of the present invention may not add to the overall potential network benefits determined to be available through the implementation of DER. In practice, knowledge of the particular DER projects that would realize these benefits characterized as described above, makes the result far more useful.

If generating projects similar to those in the Optimal DER Portfolio are developed by third parties, the method of the present invention provides information on the operating profile required for those units to permit them to make the greatest contribution to network performance under varying system conditions. This information informs the utility as to the degree of control of a third-party the utility can benefit from and what the contractual terms between the utility and the project sponsor should be.

The Optimal DER Portfolio includes dispatchable demand response specified for particular locations in the network. In addition, these specifications change for different network conditions. This information goes far beyond the present basis in the art for developing demand response programs. This information would permit a utility to design a demand response program that could request demand reductions in specific locations under specific conditions to yield the most benefit to system performance, in addition to or instead of simple energy demand reduction. Such programs could be both less invasive for customers and more valuable to utilities.

The Optimal DER Portfolio also includes specifications for reactive capacity additions in specific locations within the network under various conditions. Utilities may use this information to conclude that there is value in more flexible reactive capacity devices.

It is conceivable that an Energynet dataset could be used in an operating setting, with loads input from monitors on the system, to manage programs of this sort.

The projects in the Optimal DER Portfolio are sufficiently characterized to determine the interconnection and regulatory requirements they would be required to satisfy. While the prime movers for the generating facilities are not specified, one skilled in the art can determine what might be appropriate given the operating profile of each project.

These projects are, according to the method of this invention, the projects that can realize the greatest contribution to network performance. It follows, then, that the interconnection requirements of these projects and the permitting requirements for these projects are the requirements that are the most consequential from the standpoint of improving network performance.

The Optimal DER Portfolio projects may be used to identify those consequential requirements. Once identified, these requirements are readily evaluated by those skilled in the art for the barriers they may represent to these projects. A reasonable way to orient policies and initiatives intended to remove barriers to the implementation of DER is to focus on barriers having the greatest impacts on the set of projects that has the greatest potential to benefit network performance.

According to one embodiment of the present invention, the value of the potential network benefits yielded by the Optimal DER portfolio is determined in engineering and monetary terms as described above and illustrated in FIG. 5.

As described above, in Block 508 the increase in the network's load-serving capability attributable to the Optimal DER Portfolio projects is evaluated. This information could be used by a utility to identify planned network improvements, specifically new transmission and distribution lines that may be deferred or avoided through expanded deployment of DER projects similar to those in the Optimal DER portfolio. The Energynet dataset and the method of the present invention provides a convenient means to analyze different combinations of network additions and DER projects for their impact across the network on a variety of factors.

The monetary value of the avoided real and reactive power losses and increased load-serving capability attributable to the Optimal DER Portfolio represents an incremental source of economic support for DER projects. Many utilities and public service commissions have implemented financial incentives to promote development of distributed generation, and even more commonly, demand response. While these programs are perceived to benefit all customers, the linkage is not rigorous. It remains possible that some portion of these programs is essentially funded by shifting the cost to non-participating customers.

The value of the network benefits the Optimal DER Portfolio projects is the financial quantification of incremental network benefits that demonstrably accrue to all customers on the network if projects similar to these are developed. Thus, financial incentives for DER may be developed based on the sharing of this value. Such financial incentives would demonstrably benefit the network operator, the project participants, and non-participating customers.

Because the Optimal DER Portfolio projects are characterized in such detail, financial incentives designed around the potential value they represent may be highly targeted. For example, using a method according to one embodiment of the present invention, a utility may determine that a generating unit of a certain size, interconnected at a particular voltage level in a particular location within the network, with a particular operating profile and with a certain level of control by the utility is worth a certain dollar amount to the network.

It should be noted that the network benefits attributable to the Optimal DER Portfolio are, in general, attributable to the portfolio as a whole. If the impacts of the units are closely coupled, it may not be valid to allocate these benefits to individual projects. The values allocable to individual projects, if properly assessed, may not be as great as the whole. However, it should be apparent in the application of the methodology of this invention, which projects have the greatest impact. It may also be possible for one skilled in the art to judge a reasonable share of the total benefit attributable to individual projects or groups of projects. Finally, incentives designed to share value rather than give it away entirely, permit some margin for error.

The method of the present invention characterizes the improvements in network stability and voltage security, and by inference the improvement in power quality, attributable to the Optimal DER Portfolio. As the art advances, means to assign monetary value to improvements in network stability or power quality may gain acceptance. It is conceivable that at some point these considerations could be incorporated directly in value-sharing incentives promoting DER that benefits the network.

The methods employed could be further used for the following purposes:
- Simulation of the Energynet under a great variety of load conditions to determine appropriate operational responses for embedded DER to maintain optimum network conditions. These results could be used to:
  design network control and feedback requirements for DER
  establish contractual control provisions between the network operator and DER operators
- Assessment of the benefits of more extensive network monitoring, particularly at the distribution level, and the use of feedback such monitoring would provide.

Assessment of the benefits of automated switching capability, to allow switching of loads from one feeder to another during operation to maintain network performance.

Quantification of the potential for overall efficiency and power quality gains through active management of the network, particularly at the distribution voltage level.

Assessment of the potential for distribution-connected DER to defer or avoid transmission-level network additions.

Analysis of the network as integrated transmission and distribution, and the use of transmission analysis tools for such an integrated network represent significant departures from current practice. Moreover, analysis of T&D networks as integrated networks, combining transmission and distribution elements, and with provision for embedded DER, for assessing the potential for network performance improvement using DER, for determining operating protocols for DER and other network elements, and for other purposes, overcomes significant disadvantages of the prior art.

Analysis using an integrated network model allows the direct observation of the degree to which problems observed at the transmission level are actually the accumulation of problems at the distribution level, or vice versa. Analysis of the incorporation of DER in the network using an integrated network model allows the direct observation of the merits of mitigating network problems in a decentralized fashion close to their source, rather than in an aggregated fashion at the transmission level, perhaps far from their source.

Analysis of potential DER additions using a network model integrating transmission and distribution under different network conditions permits demonstration of how network conditions affect the entire network and how DER operational profiles must be tailored or managed to maintain network performance. Analysis of a network using an integrated model permits direct demonstration of the effects across the network and potential merits of switching loads between looped distribution feeders as one tool for enhancing network performance.

While particular embodiments and applications of the present invention have been illustrated and described herein, it is to be understood that the invention is not limited to the precise construction and components disclosed herein and that various modifications, changes, and variations may be made in the arrangement, operation, and details of the methods and apparatuses of the present invention without departing from the spirit and scope of the invention as it is defined in the appended claims.

The invention claimed is:

1. A method for analyzing an electric power transmission and distribution network for assessing impacts and benefits of distributed energy resources (DER) for the electric power transmission and distribution network, to provide indication of the extent to which the transmission-level resources and distribution-level resources impact on each other, and of the merits of remedying deficiencies near their network locations, the method comprising:

simulating the electric power transmission and distribution network with a single mathematical model, the single mathematical model including a plurality of transmission voltage-level elements, a plurality of distribution voltage-level elements, an interdependency between the plurality of transmission voltage-level elements and the plurality of distribution voltage-level elements, as an Energynet including the plurality of transmission voltage-level elements and the plurality of distribution voltage-level elements and the interdependency between the plurality of transmission voltage-level elements and the plurality of distribution voltage-level elements;

incorporating models of one or more distributed energy resources at a plurality of network locations and voltage levels within the single mathematical model to generate a modified single mathematical model;

generating a modified Energynet with the modified single mathematical model, the modified Energynet describing the effect of the incorporated models of one or more distributed energy resources on the electric power transmission and distribution network; and storing the modified Energynet in a computer storage medium.

2. A method for assessing impacts and benefits of distributed energy resources (DER) for an electric power transmission and distribution network, the method comprising:

generating an Energynet using a single mathematical model including a plurality of transmission voltage-level elements, a plurality of distribution voltage-level elements and an interdependency between the plurality of transmission voltage-level elements and the plurality of distribution voltage-level elements;

adding models for real energy sources, reactive energy sources, and combined real and reactive energy sources to modeled network locations in selected combinations to the single mathematical model;

generating one or more modified Energynets by evaluating alternative combinations of the additions to the single mathematical model for their ability to improve selected characteristics of network stability, or voltage security, or reduction of real and reactive power losses, or deferral of conventional network modifications; and storing a modified Energynet in a computer storage medium.

3. A method for assessing the potential impacts and benefits of distributed energy resources (DER) for an electric power transmission and distribution network, comprising:

generating a network model using a single mathematical model including a plurality of transmission voltage-level elements, a plurality of distribution voltage-level elements and an interdependency between the plurality of transmission voltage-level elements and the plurality of distribution voltage-level elements;

adding to the network model a set of models of real and reactive energy sources for resultant improvement in network performance, independent of considerations other than network performance;

characterizing the set of added energy sources as a performance portfolio of individual projects for distributed energy resources, including dispatchable demand reduction, capacitive elements, and power generation;

evaluating the economic value of improvements in network performance derived from proposed projects based on their similarity to the projects in the performance portfolio; and storing the performance portfolio and evaluated economic value of improvements in performance in a computer storage medium.

4. The method of claim 3, further comprising:

identifying a proposed project having a common characteristic with a project in the performance portfolio; and selectively implementing the identified proposed for beneficial economic or environmental impact and beneficial performance improvement.

* * * * *

UNITED STATES PATENT AND TRADEMARK OFFICE
CERTIFICATE OF CORRECTION

PATENT NO. : 7,398,194 B2
APPLICATION NO. : 11/510430
DATED : July 8, 2008
INVENTOR(S) : Peter B. Evans and Steven E. Schumer Page 1 of 1

It is certified that error appears in the above-identified patent and that said Letters Patent is hereby corrected as shown below:

Title Page, Item [75] Inventors
Please delete "San Jose" and insert --Santa Clara--

Title Page, Item [62], Related U.S. Application Data, Line 3
Please insert --Provisional application no. 60/411,836, filed on Sep. 18, 2002.--

Signed and Sealed this

Sixteenth Day of September, 2008

JON W. DUDAS
*Director of the United States Patent and Trademark Office*